United States Patent
Sato

(10) Patent No.: US 9,882,103 B2
(45) Date of Patent: *Jan. 30, 2018

(54) METHOD FOR PRODUCING LIGHT EMITTING DEVICE

(71) Applicant: NICHIA CORPORATION, Anan-shi (JP)

(72) Inventor: Yoshiki Sato, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/439,948

(22) Filed: Feb. 23, 2017

(65) Prior Publication Data

US 2017/0162766 A1 Jun. 8, 2017

Related U.S. Application Data

(63) Continuation of application No. 15/169,747, filed on Jun. 1, 2016, now Pat. No. 9,614,135.

(30) Foreign Application Priority Data

Jun. 1, 2015 (JP) .................................. 2015-111781

(51) Int. Cl.
*H01L 33/54* (2010.01)
*H01L 33/56* (2010.01)
(Continued)

(52) U.S. Cl.
CPC .............. *H01L 33/56* (2013.01); *H01L 33/44* (2013.01); *H01L 33/507* (2013.01); *H01L 33/54* (2013.01);
(Continued)

(58) Field of Classification Search
CPC ......... H01L 33/56; H01L 33/44; H01L 33/54; H01L 33/507; H01L 2933/0041; H01L 2933/005
See application file for complete search history.

(56) References Cited

U.S. PATENT DOCUMENTS 9,614,135 B2 * 4/2017 Sato .................... H01L 33/56
2002/0039001 A1 4/2002 Nagai et al.
(Continued)

FOREIGN PATENT DOCUMENTS

JP 2003-086846 3/2003
JP 2004-221163 8/2004
(Continued)

OTHER PUBLICATIONS

Notice of Allowance issued by the United States Patent and Trademark Office for the parent U.S. Appl. No. 15/169,747, dated Dec. 7, 2016.

*Primary Examiner* — Kyoung Lee
(74) *Attorney, Agent, or Firm* — Mori & Ward, LLP

(57) ABSTRACT

A method for producing a light emitting device includes spraying a resin mixture onto a light emitting element using a pulse spraying method to deposit the resin mixture on the light emitting element. The resin mixture includes a thixotropy imparting agent. The resin mixture is cured to form a light transmissive member via which light emitted from the light emitting element is to transmit to an outside of the light emitting device.

22 Claims, 3 Drawing Sheets

(51) Int. Cl.
*H01L 33/44* (2010.01)
*H01L 33/50* (2010.01)
(52) U.S. Cl.
CPC .................. *H01L 2933/005* (2013.01); *H01L 2933/0041* (2013.01)

(56) References Cited

U.S. PATENT DOCUMENTS

| | | | |
|---|---|---|---|
| 2007/0042173 | A1 | 2/2007 | Nagaoka et al. |
| 2010/0065861 | A1* | 3/2010 | Nagai ................ H01L 25/0753 257/88 |
| 2014/0227813 | A1* | 8/2014 | Yoneda .............. H01L 33/0095 438/33 |
| 2014/0231844 | A1 | 8/2014 | Akimoto et al. |
| 2014/0231845 | A1 | 8/2014 | Akimoto et al. |
| 2014/0252388 | A1 | 9/2014 | Kimura et al. |
| 2015/0028373 | A1 | 1/2015 | Abe et al. |

FOREIGN PATENT DOCUMENTS

| | | |
|---|---|---|
| JP | 2014-157989 | 8/2014 |
| JP | 2014-157990 | 8/2014 |
| JP | 2014-175362 | 9/2014 |
| JP | 2015-026698 | 2/2015 |

\* cited by examiner

METHOD FOR PRODUCING LIGHT EMITTING DEVICE

CROSS-REFERENCE TO RELATED APPLICATIONS

The present application is a continuation application of the U.S. patent application Ser. No. 15/169,747 filed Jun. 1, 2016, which claims priority under 35 U.S.C. § 119 to Japanese Patent Application No. 2015-111781, filed Jun. 1, 2015, entitled "Method for producing light emitting device". The contents of these applications are incorporated herein by reference in their entirety.

BACKGROUND OF THE INVENTION

Technical Field

The present invention relates to a method for producing a light emitting device.

Discussion of the Background

For example, Japanese Unexamined Patent Application Publication No. 2014-175362 discloses that, in a light-transmissive resin layer disposed on a semiconductor layer of a semiconductor light emitting element, tackiness of an upper surface is reduced by forming a concentration distribution of a filler and making the hardness of a upper surface part be higher than the hardness of a lower side part, so that adhesion to a cover tape and poor release in mounting step can be suppressed.

SUMMARY OF THE INVENTION

A method for producing a light emitting device according to one aspect of the present invention includes spraying a resin mixture onto a light emitting element using a pulse spraying method to deposit the resin mixture on the light emitting element. The resin mixture includes a thixotropy imparting agent. The resin mixture is cured to form a light transmissive member via which light emitted from the light emitting element is to transmit to an outside of the light emitting device.

A method for producing a light emitting device according to another aspect of the present invention includes providing a wavelength conversion layer of a light transmissive member on a light emitting element. The wavelength conversion layer contains a first resin and a fluorescent substance. A resin mixture is sprayed onto the wavelength conversion layer to deposit the resin mixture on the wavelength conversion layer. The resin mixture includes a second resin and a thixotropy imparting agent. The resin mixture is cured to form an outermost layer of the light transmissive member via which light emitted from the light emitting element is to transmit to an outside of the light emitting device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
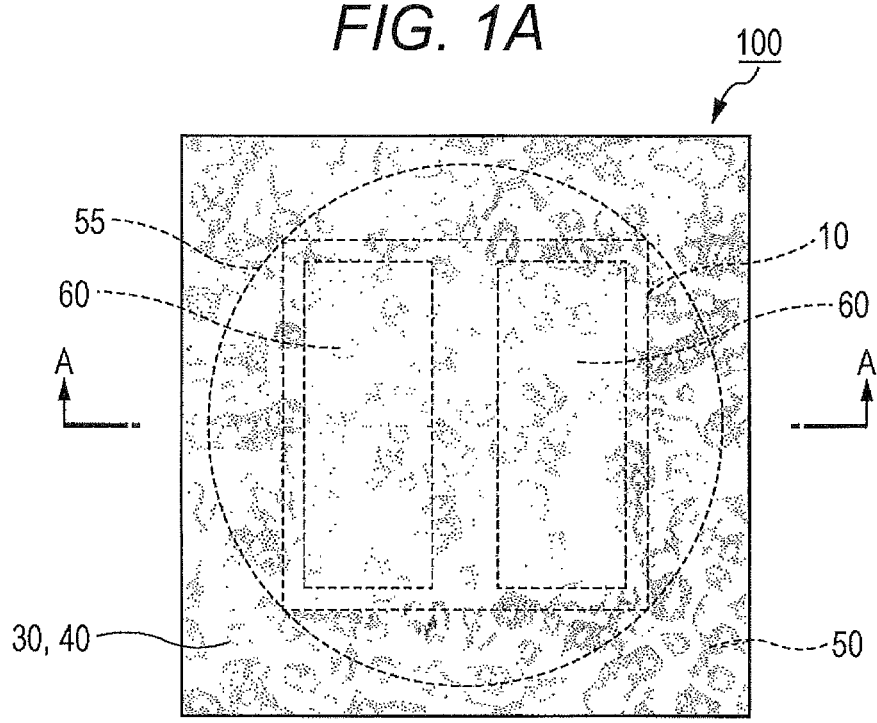
FIG. 1A is a schematic top view illustrating a light emitting device according to one embodiment of the present invention.

The embodiments will now be described with reference to the accompanying drawings, wherein like reference numerals designate corresponding or identical elements throughout the various drawings.

Hereafter, embodiments of the present invention will be described with reference to the attached drawings appropriately. However, a light emitting device and a method for producing the same described below are for embodying the technical idea of the present invention, and the invention is not limited to the following unless specifically described. The sizes and the positional relationships of the members in each of the drawings are occasionally shown exaggerated for ease of explanation.

First Embodiment

Figure 1B:
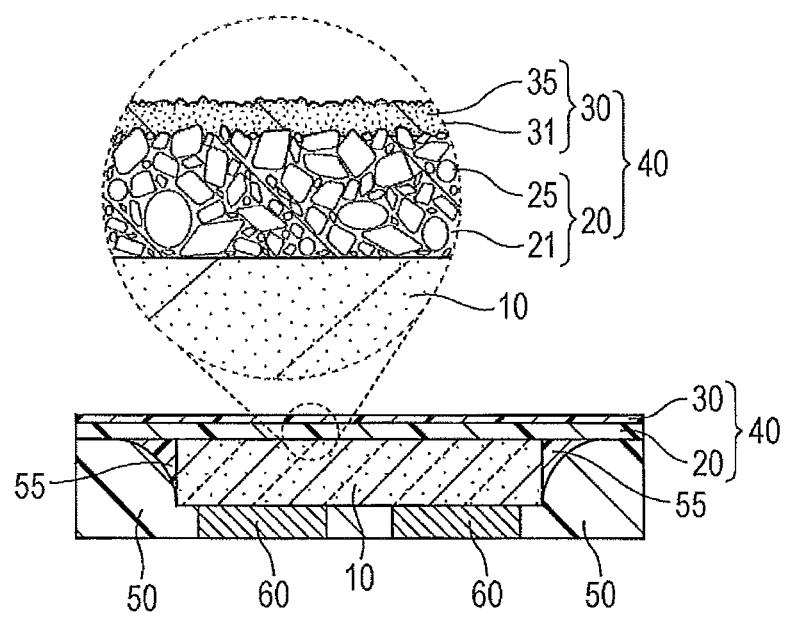
FIG. 1B is a schematic cross-sectional view at an A-A cross-section of the light emitting device of FIG. 1A.

FIG. 1A is a schematic top view illustrating a light emitting device 100 according to a first embodiment of the present invention, and FIG. 1B is a schematic cross-sectional view at an A-A cross-section of the light emitting device of FIG. 1A.

As illustrated in FIGS. 1A and 1B, the light emitting device 100 according to the first embodiment includes a light emitting element 10 and a light transmissive member 40. The light transmissive member 40 has a wavelength conversion layer 20 and an outermost layer 30. The wavelength conversion layer 20 contains a resin 21 and a fluorescent substance 25. The outermost layer 30 contains a resin 31 and a thixotropy imparting agent 35. The light transmissive member 40 transmits at least light emitted from the light emitting element 10 to outside and, in the present embodiment, transmits also light which is converted by the fluorescent substance 25 to outside. Further, a surface of the outermost layer 30 has protrusions and recesses.

In this manner, by forming the protrusions and recesses on the surface of the outermost layer 30, a contact area between the outermost layer 30 of the light emitting device 100 and a cover tape or a suction nozzle (collet) can be reduced. This allows that adhesion of the light emitting device 100 to the cover tape and/or poor release in mounting step of the light emitting device can be reduced. Also, by including the thixotropy imparting agent 35, adhesiveness (tackiness) on the surface of the resin 31 can be reduced, and this also contributes to reducing the adhesion of the light emitting device 100 to the cover tape and/or the poor release in mounting step of the light emitting device 100.

Here, the surface of the outermost layer 30 having the protrusions and recesses preferably has an arithmetic mean roughness Ra of 5 μm or more and 30 μm or less, more preferably 10 μm or more and 20 μm or less. This arithmetic mean roughness Ra is determined in accordance with JIS B0601.

Also, as illustrated in FIGS. 1A and 1B, the light emitting device 100 further includes a covering member 50, a light guiding member 55, and a pair of external connection terminals 60. The light transmissive member 40 is connected to an upper part of the light emitting element 10. The covering member 50 covers lateral side surfaces of the light emitting element 10. The pair of external connection terminals 60 is connected to a lower part of the light emitting element 10. At least a lower surface of the pair of external connection terminals 60 is exposed outside of the covering member 50. In the light emitting device 100, mainly a lower surface thereof constitutes a mounting surface and, at the time of mounting, an upper surface thereof on the opposite side, that is, the surface of the outermost layer 30, is sucked by the suction nozzle (collet), so that the configuration of the present embodiment can be achieved effectively.

The light emitting device 100 can be produced, for example, in the following manner. FIGS. 2A to 2E are schematic cross-sectional views illustrating one example of a method for producing the light emitting device 100 according to the first embodiment of the present invention. The method for producing the light emitting device 100 includes: spraying and depositing a resin 31 blended with a thixotropy imparting agent 35 onto a light emitting element 10; curing the resin 31; and forming an outermost layer 30 having protrusions and recesses formed on the surface. This allows that the light emitting device that can reduce adhesion to the cover tape as above and/or poor release in mounting can be produced in a comparatively simple and convenient manner.

Figure 2A:
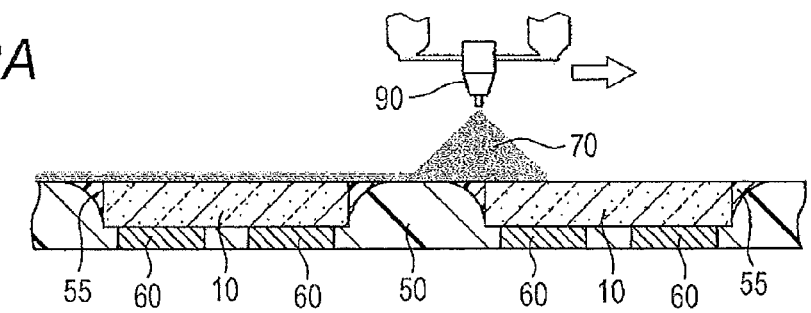
FIGS. 2A to 2E are schematic cross-sectional views illustrating one example of a method for producing a light emitting device according to one embodiment of the present invention.
Figure 2B:
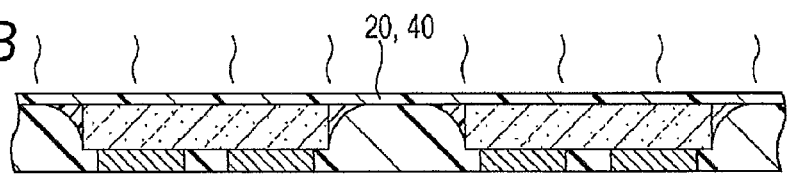
Figure 2C:
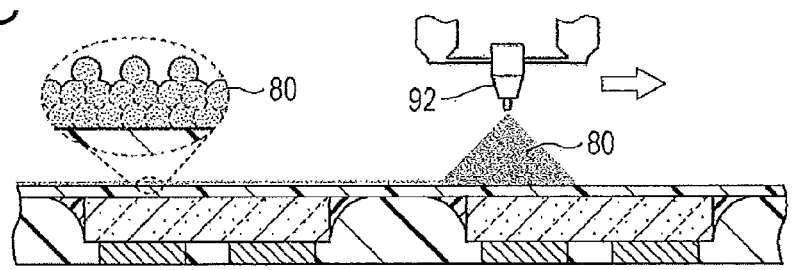
Figure 2D:
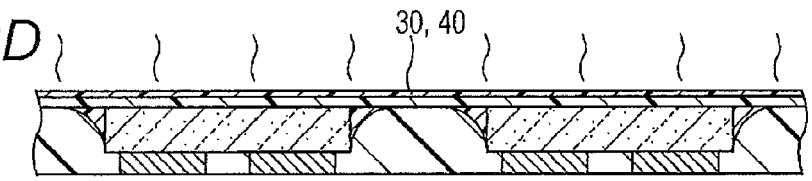
Figure 2E:
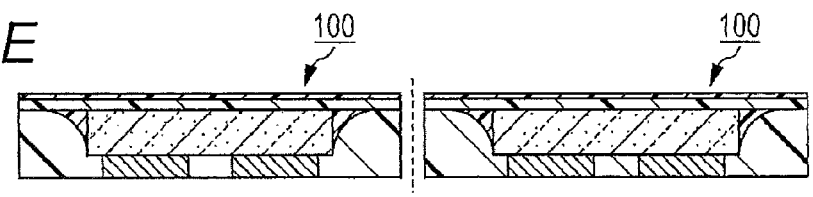

Here, an example is shown in which a combined body of light emitting devices in the state where a plurality of light emitting devices 100 are connected is fabricated as illustrated in FIGS. 2A to 2D, and finally, the combined body of light emitting devices is separate into individual light emitting devices 100 as illustrated in FIG. 2E.

First, FIGS. 2A and 2B illustrate a step of forming the wavelength conversion layer 20 on the light emitting element 10. Specifically, with use of a spraying device 90, a slurry 70 containing the resin 21 and the fluorescent substance 25 is sprayed onto the light emitting element 10, and the resin 21 is cured. Here, the slurry 70 may contain a volatile solvent in addition to the resin 21 and the fluorescent substance 25.

In this manner, the light transmissive member 40 preferably has the wavelength conversion layer 20 containing the resin 21 and the fluorescent substance 25 between the light emitting element 10 and the outermost layer 30. This allows that the outermost layer 30 can function as a layer that protects the fluorescent substance 25 of the wavelength conversion layer 20 against external air, external force, heat, or the like.

In particular, in the case where the wavelength conversion layer 20 is formed by spraying and depositing the resin 21 and the fluorescent substance 25 and thereafter curing the resin 21 as in the present embodiment, the fluorescent substance 25 may be liable to be present in the neighborhood of the surface of the wavelength conversion layer 20, so that a technical significance of protecting the fluorescent substance 25 by the outermost layer 30 may increase.

Here, in this case, a thickness of the wavelength conversion layer 20 is not particularly limited; however, a lower limit thereof is preferably 10 μm or more, more preferably 30 μm or more, from the viewpoints of a particle size and a necessary content of the fluorescent substance 25. Also, an upper limit thereof is preferably 150 μm or less, more preferably 100 μm or less, from the viewpoint of reducing leakage of light from a side surface of the layer.

Also, the spraying of the slurry 70 containing the resin 21 and the fluorescent substance 25 is preferably carried out by a pulse spraying method. This allows that the wavelength conversion layer 20 can be formed to be a homogeneous layer, so the light emitting device with light emission with little unevenness in a chromaticity distribution can be made.

The wavelength conversion layer 20 may be formed by dropping (potting) the resin 21 containing the fluorescent substance 25 onto the light emitting element 10 and curing the resin 21.

Next, FIGS. 2C and 2D illustrate a step of forming the outermost layer 30 on the wavelength conversion layer 20. Specifically, with use of a spraying device 92, a slurry 80 containing the resin 31 and the thixotropy imparting agent 35 is sprayed onto the wavelength conversion layer 20, and the resin 31 is cured. At this time, as illustrated in FIG. 2C, the resin 31 is liable to retain a particle shape formed at the time of being sprayed due to increased thixotropy, and the surfaces of a plurality of the particles including the resin 31 remain as protrusions and recesses on the surface of the outermost layer 30. Here, the slurry 80 may contain a volatile solvent in addition to the resin 31 and the thixotropy imparting agent 35.

The resin 31 is preferably any one of a silicone resin, a modified silicone resin, and a hybrid silicone resin. These silicone-based resins have good heat resistance and light resistance though have a comparatively high adhesiveness on the surface, so that the present embodiment can produce good effects.

The spraying of the slurry 80 containing the resin 31 and the thixotropy imparting agent 35 is preferably carried out by a pulse spraying method. This allows that protrusions and recesses can be formed uniformly in a wide range on the surface of the outermost layer 30.

An amount of blending the thixotropy imparting agent 35 is not particularly limited; however, the amount is preferably 1 wt % or more and 30 wt % or less, more preferably 3 wt % or more and 20 wt % or less, still more preferably 5 wt % or more and 10 wt % or less, from the viewpoint of imparting preferable thixotropy to the resin 31. Here, "wt %" means percent by weight and represents a percentage of the weight of each material relative to a total weight of the constituent materials of the layer.

A thickness of the outermost layer 30 is not particularly limited; however, a lower limit of the thickness of the outermost layer 30 may be, for example, 1 μm or more, and is preferably 3 μm or more, more preferably 5 μm or more, still more preferably larger than a particle size of the fluorescent substance 25, from the viewpoint of protecting the fluorescent substance 25. Also, an upper limit of the thickness of the outermost layer 30 may be, for example, 50 μm or less, and is preferably 20 μm or less, more preferably 15 μm or less, from the viewpoint of reducing leakage of light from a side surface of the layer.

A particle size of the thixotropy imparting agent 35 is not particularly limited; however, the particle size is preferably 1 nm or more and 1 μm or less, more preferably 5 nm or more and 100 nm or less, from the viewpoint of imparting preferable thixotropy to the resin 31. Here, the particle size in the present specification means a primary particle size and can be defined by an average particle size (median diameter $D_{50}$). Also, the particle size can be measured by a laser diffraction scattering method, an image analysis method (scanning electron microscope (SEM), transmission electron microscope (TEM)), a dynamic light scattering method, an X-ray small angle scattering method, or the like.

The thixotropy imparting agent 35 preferably contains silica nano particles. This allows that an optical loss caused by the thixotropy imparting agent 35 is small, and a decrease in a light extraction efficiency can be reduced. Here, the nano particles are defined as particles having a particle size of 1 nm or more and 100 nm or less.

A material of the resin 31 of the outermost layer is preferably of the same kind as the resin 21 of the wavelength conversion layer. This can provide a good contact between the wavelength conversion layer 20 and the outermost layer 30, and also can reduce reflection of light caused by difference in the refractive index.

Hereafter, each element in the light emitting device and the method for producing the same according to one embodiment of the present invention will be described.

Light Emitting Device 100

The light emitting device may be a chip size package (CSP) type as in the first embodiment, a package type such as PLCC (Plastic Leaded Chip Carrier), or a chip on board (COB) type. Also, the light emitting device is not limited to a top surface light emission (top view) type as in the first embodiment and may be made to be a side surface light emission (side view) type depending on a relationship of placing the external connection terminals relative to a principal light emission surface.

Light Emitting Element 10

The light emitting element includes at least a semiconductor element structure and may further includes a substrate. The light emitting element may be, for example, a light emitting diode (LED) chip. A shape of the light emitting element as viewed in a top view is preferably a quadrilateral shape, in particular, a square shape or a rectangular shape that is oblong in one direction, but may have another different shape. A side surface of the light emitting element (mainly the substrate) may be vertical or may be inclined towards an inner side or an outer side, relative to the top surface. The light emitting element preferably has positive and negative (p, n) electrodes on the same surface side; however, the light emitting element may have a double sided electrode structure in which a positive electrode and a negative electrode are disposed on two surfaces opposite to each other. The number of the light emitting elements included in one light emitting device may be either one or two or more. A plurality of light emitting elements can be connected in series or in parallel. The semiconductor element structure includes a stack of semiconductor layers, that is, at least an n-type semiconductor layer and a p-type semiconductor layer, and preferably includes an active layer interposed therebetween. The semiconductor element structure may include positive and negative electrodes and/or an insulating film. The positive and negative electrodes can be formed of gold, silver, tin, platinum, rhodium, titanium, aluminum, tungsten, palladium, nickel, or an alloy of these. The insulating film can be formed of an oxide or a nitride of at least one kind of an element selected from the group consisting of silicon, titanium, zirconium, niobium, tantalum, and aluminum. A light emission wavelength of the light emitting element can be selected from an ultraviolet region to an infrared region depending on a semiconductor material or a mixed crystal ratio thereof. As the semiconductor material, it is preferable to use a nitride semiconductor (mainly represented by a general formula $In_xAl_yGa_{1-x-y}N$ ($0 \leq x$, $0 \leq y$, $x+y \leq 1$)) which is a material capable of emitting light of a short wavelength that can efficiently excite fluorescent substance. The light emission wavelength of the light emitting element is preferably 400 nm or more and 530 nm or less, more preferably 420 nm or more and 490 nm or less, still more preferably 450 nm or more and 475 nm or less, from the viewpoints of a light emission efficiency, excitation of the fluorescent substance, a mixed color relationship to the light emission, and the like. Besides these, it is possible to use an InAlGaAs-based semiconductor, an InAlGaP-based semiconductor, zinc sulfide, zinc selenide, silicon carbide, or the like. The substrate of the light emitting element is mainly a substrate for crystal growth that can grow crystals of a semiconductor constituting the semiconductor element structure; however, the substrate may be a substrate for bonding that is to be bonded to the semiconductor element structure separated from the substrate for crystal growth. When the substrate has a light-transmissive property, it is easy to adopt flip-chip mounting, and also the light extraction efficiency can be easily enhanced. A base material of the substrate may be, for example, sapphire, spinel, gallium nitride, aluminum nitride, silicon, silicon carbide, gallium arsenic, gallium phosphorus, indium phosphorus, zinc sulfide, zinc oxide, zinc selenide, diamond, or the like. Among these, sapphire is preferable. A thickness of the substrate may be, for example, 0.02 mm or more and 1 mm or less, and is preferably 0.05 mm or more and 0.3 mm or less, from the viewpoints of strength of the substrate or a thickness of the light emitting device.

Light Transmissive Member 40

A transmittance of the light transmissive member relative to light of the light emitting element and/or light of the fluorescent substance is preferably 70% or more, more preferably 85% or more. The light transmissive member is formed of two or more layers including at least the outermost layer. In other words, the light transmissive member may include one or more layers in addition to the wavelength conversion layer and the outermost layer, or may include a layer substantially not having a wavelength conversion function in place of the wavelength conversion layer. Here, a boundary of adjacent two layers of the light transmissive member can be observed in some cases but cannot be observed in other cases.

Wavelength Conversion Layer 20

The wavelength conversion layer is formed of at least a resin and a fluorescent substance.

Resin 21

As the resin of the wavelength conversion layer, it is possible to use at least one of a silicone resin, an epoxy resin, a phenolic resin, a polycarbonate resin, an acrylic resin, a TPX resin, and a polynorbornene resin as well as modified resins and hybrid resins of these. Among these, it is preferable that the resin of the wavelength conversion layer is one of a silicone resin, a modified silicone resin, and a hybrid silicone resin. The resin of the wavelength conversion layer can function as a binding agent that binds the particles of the fluorescent substance with each other.

Fluorescent Substance 25

The fluorescent substance absorbs at least part of primary light emitted from the light emitting element and emits secondary light having a wavelength different from that of the primary light. This can provide a light emitting device that emits mixed-color light (for example, white light) of the primary light and the secondary light having a visible-range wavelength. As the fluorescent substance, it is possible to use one kind alone or two or more kinds in combination selected from specific examples given below. Specific examples of the fluorescent substance include yttrium aluminum garnet-based fluorescent material (for example, $Y_3(Al, Ga)_5O_{12}{:}Ce$), lutetium aluminum garnet-based fluorescent material (for example, $Lu_3(Al, Ga)_5O_{12}{:}Ce$), silicate-based fluorescent material (for example, $(Ba, Sr)_2SiO_4{:}$ Eu), chlorosilicate-based fluorescent material (for example, $Ca_8Mg(SiO_4)_4Cl_2:Eu$), β-sialon-based fluorescent material (for example, $Si_{6-z}Al_zO_zN_{8-z}:Eu$ (0<Z<4.2)), nitrogen-containing calcium aluminosilicate (CASN or SCASN)-based fluorescent material (for example, (Sr, Ca)$AlSiN_3$:Eu), and potassium fluorosilicate-based fluorescent material (for example, $K_2SiF_6$:Mn). In addition to this, the fluorescent substance may contain quantum dots. A quantum dot is a particle having a particle size of about 1 nm or more and about 100 nm or less, and the light emission wavelength can be changed in accordance with the particle size. Examples of the quantum dot include cadmium selenide, cadmium telluride, zinc sulfide, cadmium sulfide, lead sulfide, lead selenide, and cadmium telluride mercury.

Outermost Layer 30

A surface of the outermost layer constitutes a part of an outer surface of the light emitting device. The outermost layer is formed of at least a resin and a thixotropy imparting agent. It is preferable that the outermost layer substantially does not contain a fluorescent substance. An outermost layer substantially formed only of a resin that is blended with a thixotropy imparting agent is one preferable example.

Resin 31

As the resin of the outermost layer, it is possible to use at least one of a silicone resin, an epoxy resin, a phenolic resin, a polycarbonate resin, an acrylic resin, a TPX resin, and a polynorbornene resin as well as modified resins and hybrid resins of these. As a silicone-based resin, it is possible to use at least one of a dimethylsilicone resin, a phenyl-methyl-silicone resin, and a diphenylsilicone resin as well as modified resins and hybrid resins of these.

Thixotropy Imparting Agent 35

The thixotropy imparting agent imparts or increases thixotropy in the resin of the outermost layer. The thixotropy imparting agent may be either an inorganic substance or an organic substance. Specifically, it is possible to use silica, bentonite, stearamide, castor oil, or the like. Among these, silica is preferable form the viewpoint of the light-transmissive property.

Covering Member 50

The covering member may be, for example, a member called a "mold underfill" or the like, or a resin package. The covering member contains at least a resin as a base material, and further, it is preferable to blend a white pigment in the base material. Also, an optional filler may be blended. As the base material of the covering member, it is possible to use a thermosetting resin or a thermoplastic resin. As the thermosetting resin, it is possible to use at least one of a silicone resin, an epoxy resin, a polyimide resin, a polybismaleimidetriazine resin, and an unsaturated polyester resin as well as modified resins and hybrid resins of these. As the thermoplastic resin, it is possible to use at least one of an aliphatic polyamide resin, a semi-aromatic polyamide resin, polycyclohexylenedimethylene terephthalate, polyethylene terephthalate, polycyclohexane terephthalate, a liquid crystal polymer, and a polycarbonate resin as well as modified resins and hybrid resins of these. Examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. As the white pigment, it is possible to use one kind selected from among these alone or two or more kinds selected from among these in combination. Here, the white pigment can be different from the filler described later. A shape of the white pigment is not particularly limited, and the shape may be amorphous (fractured form); however, the shape is preferably spherical form the viewpoint of fluidity. The filler may be an organic substance; however, it is preferable to use an inorganic substance from the viewpoint that the thermal expansion coefficient is lower. Examples of the filler include silica, glass, wollastonite (calcium silicate), mica, talc, potassium titanate, and aluminum oxide. As the filler, it is possible to use one kind selected from among these alone or two or more kinds selected from among these in combination. A shape of the filler is not particularly limited, and the shape may be amorphous (fractured form); however, the shape is preferably spherical form the viewpoint of fluidity. Also, the filler that functions as a reinforcing agent is preferably in a fibrous form or in a plate form (scale form).

Light Guiding Member 55

As the light guiding member, it is possible to use at least one of a silicone resin, an epoxy resin, a phenolic resin, a polycarbonate resin, an acrylic resin, a TPX resin, and a polynorbornene resin as well as modified resins and hybrid resins of these. Among these, it is preferable that the light guiding member is formed by using one of a silicone resin, a modified silicone resin, and a hybrid silicone resin. The light guiding member may be blended with the fluorescent substance described above. Also, the light guiding member may be omitted.

External Connection Terminal 60

The external connection terminal may be a protruding electrode (bump or pillar) or a lead electrode (lead frame individually separated), or may serve also as the positive and negative electrodes of the light emitting element. The external connection terminal can be formed of small pieces of metal or alloy. Specific examples of a material for the external connection terminal include gold, silver, copper, iron, tin, platinum, zinc, nickel, aluminum, tungsten, and alloys of these. Among these, copper or copper alloy is particularly preferable because copper has good thermal conductivity and is comparatively inexpensive. Also, gold or gold alloy is preferable as well because gold is chemically stable, undergoes little surface oxidation, and has a property of being easily bonded. The external connection terminal may have a coating film such as gold or silver on the surface thereof from the viewpoint of a solder bonding property.

Spraying Devices 90, 92

As the spraying device, various spraying devices can be used. In particular, a pulse spraying device is preferable. With a pulse spraying device, intermittent ejection by air pressure can be made, and an amount of spreading can be easily adjusted, so that a film can be formed even in a minute space, and also a homogeneous film can be easily formed.

EXAMPLES

Hereafter, Examples according to one embodiment of the present invention will be described in detail. Here, it goes without saying that a gist of the present invention is not limited to the Examples shown below alone.

Example 1

A light emitting device of Example 1 is a top surface light emission-CSP type LED device having a structure of a light emitting device 100 shown in FIGS. 1A and 1B and having a substantially rectangular parallelepiped shape with a lateral width of 1.7 mm, a longitudinal width of 1.7 mm, and a thickness of 0.28 mm. A light emitting element 10 is a LED chip with a lateral width of 1 mm, a longitudinal width of 1 mm, and a thickness of 0.15 mm and having a sapphire substrate and a semiconductor element structure in which an n-type layer, an active layer, and a p-type layer of nitride semiconductor are sequentially stacked, so as to be capable of emitting blue light (in this example, a light emission peak wavelength of the light emitting element is 455 nm). A light transmissive member 40 is connected to an upper part of the light emitting element 10, that is, to the sapphire substrate. The light transmissive member 40 is formed of two layers including a wavelength conversion layer 20 that is in contact with an upper surface of the light emitting element 10, an upper surface of a covering member 50, and an upper surface of a light guiding member 55, and an outermost layer 30 that covers over the wavelength conversion layer 20. The wavelength conversion layer 20 is a layer having a thickness of 0.08 mm and containing a phenyl-methylsilicone resin (cured product) as a resin 21 and a YAG-based fluorescent material, a LAG-based fluorescent material, and a SCASN-based fluorescent material as a fluorescent substance 25. The outermost layer 30 is a layer having a thickness of 0.01 mm and containing a phenyl-methylsilicone resin (cured product), which is the same as the resin 21, as a resin 31 and silica particles having a particle size of 12 nm manufactured by Nippon Aerosil Co., Ltd. as a thixotropy imparting agent 35. An amount of blending the thixotropy imparting agent 35 is 9.1 wt %. The covering member 50 covers lateral side surfaces of the light emitting element 10 via the light guiding member 55 on a side part of the light emitting element 10 and directly covers the light emitting element 10 under a lower part of the light emitting element 10. The covering member 50 is formed of a phenyl-methylsilicone resin (cured product) containing titanium oxide in an amount of 60 wt %. The light guiding member 55 is in contact with a side surface of the light emitting element 10 and covers the lateral side surfaces of the light emitting element 10. The light guiding member 55 is formed of a phenyl-methylsilicone resin (cured product) which is the same as for the covering member 50. A pair of external connection terminals 60 are connected to the lower part of the light emitting element 10. The pair of external connection terminals 60 are each a small piece in which a coating film of nickel/gold is formed on a surface of a base member made of copper having a thickness of 0.04 mm, and are connected to positive and negative electrodes of the light emitting element 10, respectively. A lower surface of the pair of external connection terminals 60 is exposed from the covering member 50. In more detail, the lower surface of the pair of external connection terminals 60 and the lower surface of the covering member 50 form substantially the same plane and constitute the lower surface of the present light emitting device.

The light emitting device of Example 1 is obtained by fabricating a combined body of light emitting devices and separating the combined body of the light emitting devices in the following manner. First, a plurality of light emitting elements 10 in which base materials of a pair of external connection terminals 60 are respectively connected to positive and negative electrodes are arranged longitudinally and laterally at an approximately equal interval on a sheet with a sapphire substrate side facing downwards. Next, a material of a light guiding member 55 is applied with use of a dispenser so as to cover lateral side surfaces of each light emitting element 10, and the material is cured with use of an oven. Next, a covering member 50 is molded by a compression molding method so as to bury all of the light emitting elements 10, and thereafter the covering member 50 is ground to expose the external connection terminals 60. Next, a coating film of nickel/gold is formed on the base material of the pair of external connection terminals 60 of each light emitting element 10 with use of a sputtering apparatus. Next, the sheet is peeled off. Thereafter, a slurry 70 containing a resin 21, a fluorescent substance 25, and n-heptane as a solvent is sprayed onto a continuous upper surface of the light emitting element 10, the covering member 50, and the light guiding member 55 by using a pulse spraying device as a spraying device 90. The ratio of the slurry is resin 21:fluorescent substance 25:solvent=10:15:25. In this step, the sapphire substrate side of the light emitting element 10 face upwards. Subsequently, the resin 21 is temporarily cured with use of an oven to form a wavelength conversion layer 20. Next, a slurry 80 containing a resin 31, a thixotropy imparting agent 35, and n-heptane as a solvent (resin 31:thixotropy imparting agent 35:solvent=10:1:25) is sprayed onto an upper surface of the wavelength conversion layer 20 by using a pulse spraying device as a spraying device 92. Subsequently, the resin 31 is temporarily cured with use of an oven to form an outermost layer 30. Thereafter, the resins 21, 31 are fully cured further with use of an oven to complete a light transmissive member 40. Finally, the combined body of the light emitting devices is longitudinally and laterally cut with use of a dicing apparatus so as to split the combined body into individual light emitting devices.

Comparative Example 1

A light emitting device of Comparative Example 1 is fabricated in the same manner as in the light emitting device of Example 1 except that the thixotropy imparting agent 35 is not blended into the resin 31 of the outermost layer.

Figure 3A:
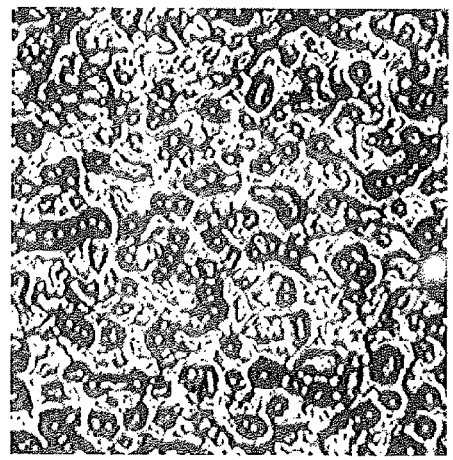
FIG. 3A is a microscope photograph of an upper surface of an outermost layer in a light emitting device showing one example according to one embodiment of the present invention.
Figure 3B:
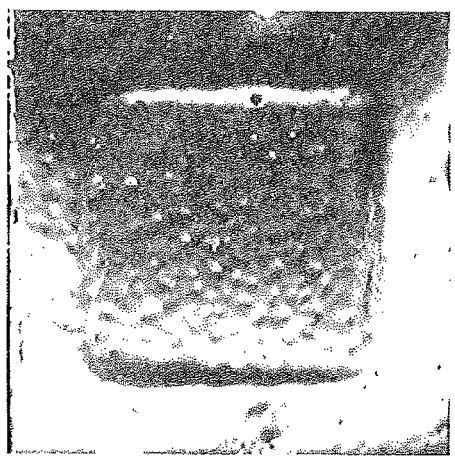
FIG. 3B is a microscope photograph of an upper surface of an outermost layer in a light emitting device showing one comparative example according to one embodiment of the present invention.

FIG. 3A is a microscope photograph of an upper surface of an outermost layer in the light emitting device of Example 1, and FIG. 3B is a microscope photograph of an upper surface of an outermost layer in the light emitting device of Comparative Example 1. As illustrated in FIGS. 3A and 3B, the upper surface of the outermost layer in the light emitting device of Comparative Example 1 is comparatively flat and has a luster, whereas the upper surface of the outermost layer in the light emitting device of the first Example has fine protrusions and recesses. Also, an arithmetic mean roughness Ra of the upper surface of the outermost layer in three samples of the light emitting device of Comparative Example 1 is 3.02 μm, 3.76 μm, and 4.01 μm, whereas an arithmetic mean roughness Ra of the upper surface of the outermost layer in three samples of the light emitting device of Example 1 is 12.81 μm, 13.36 μm, and 13.88 μm. Here, this arithmetic mean roughness Ra is measured, for example, by using a laser microscope VK-9510 manufactured by Keyence Corporation. Further, in the light emitting device of Example 1, adhesion to a cover tape and/or poor release in mounting is reduced as compared with the light emitting device of Comparative Example 1.

Obviously, numerous modifications and variations of the present invention are possible in light of the above teachings. It is therefore to be understood that within the scope of the appended claims, the invention may be practiced otherwise than as specifically described herein.

What is claimed is:

1. A method for producing a light emitting device, comprising:
   spraying a resin mixture onto a light emitting element using a pulse spraying method to deposit the resin mixture on the light emitting element, the resin mixture including 1 wt % or more and 30 wt % or less of a thixotropy imparting agent; and curing the resin mixture to form a light transmissive member via which light emitted from the light emitting element is to transmit to an outside of the light emitting device.

2. The method according to claim 1, wherein the resin mixture comprises a silicone resin, a modified silicone resin, or a hybrid silicone resin.

3. The method according to claim 1, further comprising: providing a wavelength conversion layer on the light emitting element, the resin mixture being sprayed onto the wavelength conversion layer on the light emitting element.

4. The method according to claim 1, wherein the light transmissive member has an outermost layer having a thickness of 3 µm or more and 20 µm or less.

5. The method according to claim 1, wherein the thixotropy imparting agent comprises silica nano particles.

6. The method according to claim 1, wherein the light transmissive member has a wavelength conversion layer between the light emitting element and an outermost layer of the light transmissive member, the wavelength conversion layer containing an additional resin and a fluorescent substance.

7. The method according to claim 6, wherein the resin contained in the resin mixture is a same kind as the additional resin of the wavelength conversion layer.

8. The method according to claim 6, wherein the wavelength conversion layer is formed by spraying the additional resin and the fluorescent substance, and by curing the additional resin.

9. The method according to claim 8, wherein the additional resin and the fluorescent substance are sprayed using a pulse spraying method.

10. The method according to claim 1, wherein the light emitting device comprises
the light transmissive member connected to an upper part of the light emitting element,
a covering member to cover lateral side surfaces of the light emitting element, and
a first external connection terminal and a second external connection terminal which are connected to a lower part of the light emitting element so that at least a lower surface of each of the first and second external connection terminals is exposed outside of the covering member.

11. The method according to claim 6, wherein the wavelength conversion layer has an outermost surface having protrusions and recesses on the wavelength conversion layer.

12. A method for producing a light emitting device, comprising:
providing a wavelength conversion layer on a light emitting element, the wavelength conversion layer containing a first resin and a fluorescent substance;
spraying a resin mixture onto the wavelength conversion layer to deposit the resin mixture on the wavelength conversion layer, the resin mixture including a second resin and a thixotropy imparting agent; and
curing the resin mixture to form an outermost layer of a light transmissive member which includes the wavelength conversion layer and via which light emitted from the light emitting element is to transmit to an outside of the light emitting device.

13. The method according to claim 12, wherein the second resin comprises a silicone resin, a modified silicone resin, or a hybrid silicone resin.

14. The method according to claim 12, wherein the resin mixture is sprayed onto the light emitting element using a pulse spraying method.

15. The method according to claim 12, wherein an amount of the thixotropy imparting agent in the resin mixture is 1 wt % or more and 30 wt % or less.

16. The method according to claim 12, wherein the outermost layer has a thickness of 3 µm or more and 20 µm or less.

17. The method according to claim 12, wherein the thixotropy imparting agent comprises silica nano particles.

18. The method according to claim 12, wherein the second resin contained in the resin mixture is a same kind as the first resin of the wavelength conversion layer.

19. The method according to claim 12, wherein the wavelength conversion layer is formed by spraying the first resin and the fluorescent substance, and by curing the first resin.

20. The method according to claim 19, wherein the first resin and the fluorescent substance are sprayed using a pulse spraying method.

21. The method according to claim 12, wherein the light emitting device comprises
the light transmissive member connected to an upper part of the light emitting element,
a covering member to cover lateral side surfaces of the light emitting element, and
a first external connection terminal and a second external connection terminal which are connected to a lower part of the light emitting element so that at least a lower surface of each of the first and second external connection terminals is exposed outside of the covering member.

22. The method according to claim 12, wherein the wavelength conversion layer has an outermost surface having protrusions and recesses on the wavelength conversion layer.

* * * * *